United States Patent
Yamaguchi et al.

[11] Patent Number: 5,926,703
[45] Date of Patent: Jul. 20, 1999

[54] LDD DEVICE HAVING A HIGH CONCENTRATION REGION UNDER THE CHANNEL

[75] Inventors: Yasuo Yamaguchi; Hans-Oliver Joachim; Yasuo Inoue, all of Hyogo, Japan

[73] Assignee: Mitsubishi Denki Kabushiki Kaisha, Tokyo, Japan

[21] Appl. No.: 08/785,277

[22] Filed: Jan. 21, 1997

Related U.S. Application Data

[62] Division of application No. 08/557,558, Nov. 14, 1995., Pat. No. 5,641,980

[30] Foreign Application Priority Data

Jun. 16, 1995 [JP] Japan ................................ 7-150536

[51] Int. Cl.⁶ .................................................. H01L 21/44
[52] U.S. Cl. .......................................... 438/163; 438/305
[58] Field of Search ...................................... 438/151–157, 438/161–166, 305

[56] References Cited

U.S. PATENT DOCUMENTS

| | | |
|---|---|---|
| 4,656,731 | 4/1987 | Lam et al. . |
| 4,697,198 | 9/1987 | Komori et al. . |
| 4,829,018 | 5/1989 | Wahlstrom . |
| 4,927,779 | 5/1990 | Dhong et al. . |
| 5,185,535 | 2/1993 | Farb et al. ............................... 257/351 |
| 5,294,821 | 3/1994 | Iwamatsu . |
| 5,359,219 | 10/1994 | Hwang . |
| 5,440,161 | 8/1995 | Iwamatsu et al. . |
| 5,506,436 | 4/1996 | Hayashi et al. . |
| 5,736,435 | 4/1998 | Venkatesan et al. ................... 438/151 |
| 5,780,236 | 7/1998 | Dennison et al. ...................... 438/152 |

FOREIGN PATENT DOCUMENTS

| | | |
|---|---|---|
| 0 480 373 | 4/1992 | European Pat. Off. . |
| 0 694 977 | 1/1996 | European Pat. Off. . |
| 4-146628 | 5/1992 | Japan . |

OTHER PUBLICATIONS

Patent Abstracts of Japan, vol. 012, No. 250 (E–633), Jul. 14, 1988, JP–A–63 037667, Feb. 18, 1988.

Patent Abstracts of Japan, vol. 014, No. 133 (E–0902), Mar. 13, 1990, JP–A–02 001173, Jan. 5, 1990.

Patent Abstracts of Japan, vol. 011, No. 077 (E–487), Mar. 7, 1987, JP–A–61 232676, Oct. 16, 1986.

*Primary Examiner*—Richard A Booth
*Attorney, Agent, or Firm*—Oblon, Spivak, McClelland, Maier & Neustadt, P.C.

[57] ABSTRACT

It is an object to obtain a semiconductor device with the LDD structure having both operational stability and high speed and a manufacturing method thereof. A high concentration region (11) with boron of about $1 \times 10^{18}/cm^3$ introduced therein is formed extending from under a channel formation region (4) to under a drain region (6) and a source region (6') in a silicon substrate (1). The high concentration region (11) is formed in the surface of the silicon substrate (1) under the channel formation region (4), and is formed at a predetermined depth from the surface of the silicon substrate (1) under the drain region (6) and the source region (6'). A low concentration region (10) is formed in the surface of the silicon substrate (1) under the drain region (6) and the source region (6'). The formation of the high concentration region only in the surface of the semiconductor substrate under the channel formation region surely suppresses an increase in the leakage current and an increase in the drain capacitance.

7 Claims, 7 Drawing Sheets

LDD DEVICE HAVING A HIGH CONCENTRATION REGION UNDER THE CHANNEL

This is a Division of application Ser. No. 08/557,558 filed on Nov. 14, 1995 now U.S. Pat. No. 5,641,980.

BACKGROUND OF THE INVENTION

1. Field of the Invention

The present invention relates to a semiconductor device of the LDD structure formed on an insulating substrate and a manufacturing method thereof.

2. Description of the Background Art

FIG. 12 and FIG. 13 are sectional views showing a method for manufacturing a conventional semiconductor device of the LDD structure.

As shown in FIG. 13, a silicon layer 3 is provided on a silicon substrate 1 with a buried oxide film 2 which is a silicon oxide film interposed therebetween. Such structure including the silicon substrate 1, the oxide film 2 and the silicon layer 3 is called an SOI substrate. This SOI substrate is manufactured by the SIMOX method by the oxygen ion implantation method, the wafer sticking method, etc. Part of the silicon layer 3 is removed or selectively oxidized so as to be electrically isolated from other elements.

A gate electrode 8 is provided on the silicon layer 3 with a gate insulating film 7, such as a thin oxide film of about 100 angstroms interposed therebetween. A channel formation region 4 for formation of a channel is provided in part of the silicon layer 3 under the gate electrode 8. Usually, the conductivity type of the channel formation region 4 is P-type in NMOS and it is N-type in PMOS, which is formed by introducing impurities of a conductivity type opposite to that of the source, drain portions, but which may be of the accumulation mode in which impurities of the same conductivity type as the source and drain are introduced, according to circumstances. The accumulation mode allows a low threshold voltage.

Sidewalls 9 are formed on the side wall of the gate electrode 8 above the channel formation region 4. An additional drain region 5 and an additional source region 5' are formed under the sidewalls 9, 9, and a drain region 6 and a source region 6' are formed adjacent to the additional drain region 5 and the additional source region 5', respectively.

In such a structure, if a certain gate voltage is applied to the gate electrode 8, carriers of the same conductivity type as the source, drain are caused in the channel formation region 4, and the amount the carriers changes depending on the applied gate voltage, and thus the MOS operation of controlling the current value with the gate voltage is obtained.

The additional drain region 5 and the additional source region 5' are used to moderate the drain electric field to enhance the operational breakdown voltage.

Actually, the drain region 6, the source region 6' and the gate electrode 8 are respectively connected to metal lines with low resistance, such as aluminum, for extension to enable connections with other transistors, and the like.

Next, a method of manufacturing this structure will be described.

As shown in FIG. 12, the silicon layer 3 is formed on the, silicon substrate 1 with the buried oxide film 2 interposed therebetween to realize the SOI structure. Usually, such structure is formed by performing a high temperature heat treatment at about 1300° C. after adding oxygen ions of about 0.4–2.0×10$^{18}$/cm$^2$ into the silicon substrate 1. In the case of a dose of 0.4×10$^{18}$/cm$^2$, a film thickness of the buried oxide film 2 is 800 angstroms. The method of forming by sticking silicon substrates with oxidized surface may also be adopted.

Next, part of the silicon layer 3 is removed by the reactive ion etching (RIE) using photoresist and an active region for formation of elements is formed in the remaining region. The active region may he formed by oxidizing an isolation region by the selective oxidation method. Next, boron of about 5×10$^{11}$/cm$^2$ is implanted at 20 keV to form the channel formation region 4 in the silicon layer 3. Although impurities of p-type are introduced herein, impurities of n-type may possibly be introduced depending on circumstances.

Subsequently, with the gate insulating film 7 of about 100 angstroms interposed therebetween, a gate electrode material formed of an n-type polysilicon film doped with phosphorus is deposited. Now, photoresist (not shown) is provided in a region to be the gate electrode 8 and the polysilicon film is etched using it as a mask to form the gate electrode 8. After removing the photoresist, phosphorus is added to about 1×10$^{13}$ cm$^2$ at 30 keV to form the additional drain region 5 and the additional source region 5'. Furthermore, after depositing a CVD oxide film of about 1500 angstroms, the sidewalls 9 are formed on the side wall of the gate electrode 8 by RIE. Next, arsenic is added to about 2×10$^{15}$/cm$^2$ at 50 keV to form the drain region 6 and the source region 6', thus obtaining the structure shown in FIG. 13.

If a low dose substrate with the buried oxide film 2 thinner than about 1000 angstroms is used as an SOI substrate, there were problems as described below. First, if the concentration of the silicon substrate 1 is low, a depletion layer deeply extends in the silicon substrate. The length td of the depletion layer is obtained from the equation (I) below.

$$V = q \cdot Na \cdot (t\,\text{box} \cdot td/\epsilon ox + td^2/2\epsilon si) \quad\quad (I)$$

Here, V is an applied voltage applied over the buried cxide film 2, q is an elementary electric charge amount, Na is a substrate concentration, t box is a film thickness of the buried oxide film 2 and ϵ ox is a dielectric constant of the silicon oxide film.

In the case of the substrate concentration (concentration of impurity of the substrate) of 1×10$^{15}$/cm$^3$ and the film thickness of the buried oxide film 2 of 800 angstroms, when the applied voltage V is 2.5 V, a width of the depletion layer in the vicinity of the drain reaches 1.8 μm. If the depletion layer extends such long, as shown by the arrow in FIG. 14, potential in the silicon sLibstrate 1 under the channel formation region 4 increases. The increase of the potential in the silicon substrate 1 increases potential in the lower part of the channel formation region 4 itself, causing a problem of being weak to the short channel effect.

FIG. 15 shows the potential distribution of an NMOS with the single drain structure with the channel length (gate length) L=0.5 μm, a film thickness of the silicon layer 3 of 1000 angstroms, a film thickness of the buried oxide film 2 of 800 angstroms, an impurity concentration of the silicon substrate 1 of 1×10$^{14}$/cm$^3$ and an impurity concentration of the channel formation region 4 of 5×10$^{16}$/cm$^3$, which was obtained by device simulation. Here, the gate material is n$^+$ polysilicon gate, the gate voltage is 0 V, and the drain voltage is 0.1 V. It is well seen from the results of the device simulation that the potential rises in the silicon substrate 1.

In order to suppress the increase of the potential, a method of increasing the substrate concentration of the silicon substrate 1 is possible. For example, if the substrate concentration is set to $1 \times 10^{18}/cm^3$ and the film thickness of the buried oxide film is set to 800 angstroms, the thickness of a depletion layer becomes very small as about 100 angstroms in the case of application of 2.5 V. Accordingly, the increase of the potential under the channel formation region 4 can be suppressed to suppress the short channel effect.

As a result of increasing the substrate concentration of the silicon substrate 1. however, the extension of a depletion layer in the silicon substrate 1 under the drain region 6 is also suppressed, increasing the junction capacitance in this region, and which will produce another problem that the high speed operation, which is a feature of the SOI, is not obtained.

The problems of the conventional semiconductor device of the LDD structure discussed above can be summarized as follows.

* If th econcentration of the silicon substrate is low, a depletion layer extends under the channel formation region and potential in that region increases. This will cause an increase in potential in the lower portion of the chancel formation region (in the interface with the buried oxide film), increase the leakage current, and deteriorate performance characteristics.

* Increasing the concentration of the silicon substrate to suppress the potential increase to suppress the leakage current will also suppress the extension of a depletion layer under the drain to increase the drain capacitance, and which will reduce the operation speed.

SUMMARY OF THE INVENTION

According to a first aspect of the present invention, a semiconductor device comprises a semiconductor substrate of a first conductivity type and having a first impurity concentration, an insulating layer formed on the semiconductor substrate, a semiconductor layer formed on the insulating layer, the semiconductor layer including a region of a second conductivity type, a gate insulating film selectively formed on the semiconductor layer, a gate electrode formed on the gate insulating film, and first and second sidewalls respectively formed on sides of the gate electrode, wherein the semiconductor layer is defined as a channel formation region under the gate insulating film, defined as first and second additional semiconductor regions of the second conductivity type under the first and second sidewalls, and defined as first and second semiconductor regions of the second conductivity type in regions adjacent respectively to the first and second additional semiconductor regions on sides opposite to the channel formation region, aid a predetermined voltage is applied to the gate electrode to cause a current to flow between the first semiconductor region and the second semiconductor region through the channel formation region, and wherein the semiconductor substrate has a high concentration region of the first conductivity type and having a second impurity concentration higher than the first impurity concentration, the high concentration region being formed extending from under the channel formation region to under the respective first and second semiconductor regions, the high concentration region being formed in a surface of the semiconductor substrate under the channel formation region, and in a region at a predetermined depth from the surface of the semiconductor substrate under the respective first and second semiconductor regions.

Preferably, according to a semiconductor device of a second aspect of the present invention, the gate electrode comprises a first partial gate electrode formed on the gate insulating film and a second partial gate electrode formed on the first partial gate electrode, and at least one of the first and second partial gate electrodes is formed of a refractory metal.

In a third aspect of the present invention, a semiconductor device comprises a semiconductor substrate of a first conductivity type and having a first impurity concentration, an insulating layer formed on the semiconductor substrate, a semiconductor layer formed on the insulating layer, the semiconductor layer including a region of a second conductivity type, a gate insulating film selectively formed on the semiconductor layer, a gate electrode formed on the gate insulating film, and first and second sidewalls respectively formed on sides of the gate electrode, wherein the semiconductor layer is defined as a channel formation region under the gate insulating film, defined as first and second additional semiconductor regions of the second conductivity type under the first and second sidewalls, and defined as first and second semiconductor regions of the second conductivity type in regions adjacent respectively to the first and second additional semiconductor regions on sides opposite to the channel formation region, and a predetermined voltage is applied to the gate electrode to cause a current to flow between the first semiconductor region and the second semiconductor region through the channel formation region, and wherein the semiconductor substrate includes a high concentration region of the first conductivity type and having a second impurity concentration higher than the first impurity concentration, the high concentration region being formed in a surface of the semiconductor substrate extending from under the channel formation region to under parts of the respective first and second additional semiconductor regions.

According to a fourth aspect of the present invention, in a semiconductor device comprising a first transistor of a second conductivity type formed on a first semiconductor substrate of a first conductivity type and having a first impurity concentration and a second transistor of the first conductivity type formed on a second semiconductor substrate of the second conductivity type and having a second impurity concentration, the first transistor comprises, the first semiconductor substrate, a first insulating layer formed on the first semiconductor substrate, a first semiconductor layer formed on the first insulating layer, the first semiconductor layer including a region of the second conductivity type, a first gate insulating film selectively formed on the first semiconductor layer, a first gate electrode formed on the first gate insulating film, and first and second sidewalls formed on sides of the first gate electrode, respectively, wherein the first semiconductor layer is defined as a first channel formation region under the first gate insulating film, defined as first and second additional semiconductor regions of the second conductivity type under the first and second sidewalls, and defined as first and second semiconductor It regions of the second conductivity type in regions adjacent to the first and second additional semiconductor regions respectively on sides opposite to the first channel formation region, and a predetermined voltage is applied to the first gate electrode to cause a current to flow between the first semiconductor region and the second semiconductor region through the channel formation region, and wherein the first semiconductor substrate includes a first high concentration region of the first conductivity type and having a third impurity concentration higher than the first impurity concentration, the first high concentration region being formed extending from under the first channel formation region to under the respective first and second semiconductor regions, the first high concentration region being formed in a surface of the first semiconductor substrate under the first channel formation region, and in a region at a predetermined depth from the surface of the first semiconductor substrate under the respective first and second semiconductor regions, and the second transistor comprises, the second semiconductor substrate, a second insulating layer formed on the second semiconductor substrate, a second semiconductor layer formed on the second insulating layer, the second semiconductor layer including a region of the first conductivity type, a second gate insulating film selectively formed on the second semiconductor layer, a second gate electrode formed on the second gate insulating film, and third and fourth sidewalls formed on sides of the second gate electrode, respectively, wherein the second semiconductor layer is defined as a second channel formation region under the second gate insulating film, defined as third and fourth additional semiconductor regions of the first conductivity type under the third and fourth sidewalls, and defined as third and fourth semiconductor regions of the first conductivity type in regions adjacent to the third and fourth additional semiconductor regions, respectively, on sides opposite to the second channel formation region, and a predetermined voltage is applied to the second gate electrode to cause a current to flow between the third semiconductor region and the fourth semiconductor region through the second channel formation region, and wherein the second semiconductor substrate includes a second high concentration region of the second conductivity type and having a fourth impurity concentration higher than the second impurity concentration, the second high concentration region being formed extending from under the second channel formation region to under the respective third and fourth semiconductor regions, the second high concentration region being formed in a surface of the second semiconductor substrate under the second channel formation region, and in a region at a predetermined depth from the surface of the second semiconductor substrate under the respective third and fourth semiconductor regions.

Preferably, according to a semiconductor device of a fifth inspect of the present invention, the first semiconductor substrate and the second semiconductor substrate are formed adjacent to each other, the first semiconductor substrate further includes a third high concentration region of the first conductivity type and having a fifth impurity concentration higher than the first impurity concentration in its surface, and the second semiconductor substrate further includes a fourth high concentration region of the second conductivity type and having a sixth impurity concentration higher than the second impurity concentration in its surface, and wherein the third high concentration region is provided with a first power—supply voltage, the fourth high concentration region is provided with a second power—supply voltage, and the first and second power-supply voltages are set so that a reverse bias is established between the first semiconductor substrate and the second semiconductor substrate.

According to a sixth aspect of the present invention, a method of manufacturing a semiconductor device comprises the steps of (a) preparing a base body including a semiconductor substrate of a first conductivity type and having a first impurity concentration, an insulating layer formed on the semiconductor substrate, and a semiconductor layer formed on the insulating layer, (b) selectively forming an insulating film on the semiconductor layer, (c) forming a conductive layer on the insulating film, (d) forming a resist on the conductive layer and patterning the resist into a predetermined form, (e) performing an etching process to the conductive layer using the resist as a mask, remaining conductive layer and insulating film being defined as a gate electrode and a gate insulating film, respectively, the semiconductor layer being defined as a channel formation region in a region under the gate electrode and defined as electrode regions in other region, (f) implanting impurities of the first conductivity type with predetermined implantation energy from above to form a high concentration region having a second impurity concentration higher than the first impurity concentration in the semiconductor substrate, the high concentration region being formed extending from under the channel formation region to under the electrode regions, the high concentration region being formed in a surface of the semiconductor substrate under the channel formation region, and in a region at a predetermined depth from the surface of the semiconductor substrate under the electrode regions, (g) introducing impurities of the second conductivity type into the semiconductor layer using the gate electrode as a mask, (h) forming first and second sidewalls on both sides of the gate electrode, and (i) introducing impurities of the second conductivity type into the semiconductor layer using the gate electrode and the first and second sidewalls as masks, the semiconductor layer being defined as first and second additional semiconductor regions of the second conductivity type under the first and second sidewalls, and defined as first and second semiconductor regions of the second conductivity type in regions respectively adjacent to the first and second additional semiconductor regions on sides opposite to the channel formation region, a predetermined voltage is applied to the gate electrode to cause a current to flow between the first semiconductor region and the second semiconductor region through the channel formation region.

Preferably, according to a method of manufacturing a semiconductor device of a seventh aspect of the present invention, the step (f) is carried out without removing the resist formed in the step (e).

Preferably, according to a method of manufacturing a semiconductor device of an eighth aspect of the present invention, the conductive layer is formed of first and second partial conductive layers, and the step (c) comprises the steps of (c-1) forming the first partial conductive layer on the insulating film, and (c-2) forming the second partial conductive layer on the first partial conductive layer, one of the first and second partial conductive layers being a refractory metal layer.

According to a ninth aspect of the present invention, a method of manufacturing a semiconductor device comprises the steps of (a) preparing a base body including a semiconductor substrate of a first conductivity type and having a first impurity concentration, an insulating layer formed on the semiconductor substrate, and a semiconductor layer formed on the insulating layer, (b) forming a first resist on the semiconductor layer and patterning to provide an opening in the center of the first resist, (c) introducing impurities of the first conductivity type using the first resist as a mask to form a high concentration region having a second impurity concentration higher than the first impurity concentration in the surface of the semiconductor substrate under the opening of the resist, (d) selectively forming an insulating film on the semiconductor layer, (e) forming a conductive layer on the insulating film, (f) forming a second resist on the conductive layer and patterning the second resist into a predetermined form, (g) performing an etching process to the conductive layer using the second resist as a mask, the remaining conductive layer and insulating film being defined as a gate electrode and a gate insulating film, respectively, the semiconductor layer being defined as a channel formation region in a region under the gate electrode and defined as electrode regions in other region, (h) adding impurities of the second conductivity type into the semiconductor layer using the gate electrode as a mask, (i) forming first and second sidewalls on both sides of the gate electrode, the first and second sidewalls being formed so that the high concentration region is located from under the channel formation region to under parts of the respective first and second sidewalls, and (j) introducing impurities of the second conductivity type into the semiconductor layer using the gate electrode and the first and second sidewalls as masks, the semiconductor layer being defined as first and second additional semiconductor regions of the second conductivity type under the first and second sidewalls, and defined as first and second semiconductor regions of the second conductivity type in regions adjacent to the first and second additional semiconductor regions, respectively, on sides opposite to the channel formation region, and a predetermined voltage is applied to the gate electrode to cause a current to flow between the first semiconductor region and the second semiconductor region through the channel formation region.

According to the first aspect of the present invention, the semiconductor substrate has a high concentration region of the first conductivity type and having the second impurity concentration which is higher than the first impurity concentration and the high concentration region is formed from under the channel formation region to under each of the first and second semiconductor regions, in the surface of the semiconductor substrate under the channel formation region, and in a region at a predetermined depth from the surface of the semiconductor substrate under each of the first and second semiconductor regions.

Accordingly, when a predetermined voltage is applied to the gate electrode to enter an operation state, the high concentration region suppresses the extension of a depletion layer in the surface region of the semiconductor substrate under the channel formation region to surely prevent the short channel effect caused by an increase in potential in the interface of the channel formation region on the insulating layer side resulting from the effect of a depletion layer extending in the semiconductor substrate.

Furthermore, as the surface region of the semiconductor substrate under the first and second semiconductor regions is set to the first impurity concentration which is relatively low, a depletion layer can be extended to sufficiently reduce the junction capacitance in the vicinity of a region to be a drain region in the first and second semiconductor regions.

As a result, the short channel effect is certainly avoided and the performance characteristics are not deteriorated, and the junction capacitance in the vicinity of the drain region can be sufficiently reduced so as to maintain the high-speed operation.

In addition, as the high concentration region is formed extending from under the channel formation region to the first and second semiconductor regions, the high concentration region cuts off contact between a potential rise on the first semiconductor region side and a potential rise on the second semiconductor region side, producing the effect of causing no trouble with the potential rise.

According to the second aspect of the present invention, the gate electrode is formed of first and second partial gate electrodes and at least one of the first and second partial gate electrodes is formed of a refractory metal layer, and the refractory metal layer serves as a layer for blocking impurity implantation with high blocking capability when impurities of the first conductivity type are added with predetermined energy to form the high concentration region after formation of the gate electrode.

As a result, even if the film thickness of the gate electrode is relatively small, the high concentration region can be accurately formed from under the channel formation region to under each of the first and second semiconductor regions, in the surface of the semiconductor substrate under the channel formation region, in the region at a predetermined depth from the surface of the semiconductor substrate under each of the first and second semiconductor regions, so that a difference in level resulting from the gate electrode is reduced and the yield of metal interconnection formed on the gate electrode can be increased.

According to the third aspect of the present invention, the semiconductor substrate has a high concentration region of the first conductivity type and having the second impurity concentration which is higher than the first impurity concentration, and this high concentration region is formed in the surface of the semiconductor substrate extending from under the channel formation region to under part of each of the first and second additional semiconductor regions.

Accordingly, when a predetermined voltage is applied to the gate electrode to enter an operation state, the high concentration region suppresses the extension of a depletion layer in the surface region of the semiconductor substrate under the channel formation region to surely prevent the short channel effect caused by an increase in potential in the interface of the channel formation region on the insulating layer side resulted from the effect of a depletion layer extending in the semiconductor substrate.

Furthermore, as the surface region of the semiconductor substrate under the first and second semiconductor regions is set to the first impurity concentration which is relatively low, a depletion layer can be extended to sufficiently reduce the junction capacitance in the vicinity of a region to be a drain region in the first and second semiconductor regions.

As a result, the high speed operation can be maintained by sufficiently reducing the junction capacitance in the vicinity of the drain region without causing deterioration of the performance characteristics by surely avoiding the short channel effect.

In addition, ends of the high concentration region are located under part of the first and second additional semiconductor regions. It is preferable to avoid deterioration of the performance characteristics and maintain the high speed operation that the boundary of the high concentration region occurs under the first and second additional semiconductor regions because they are regions which are required to play an intermediate role between the channel formation region and the first and second semiconductor regions.

According to the fourth aspect of the present invention, the semiconductor device includes a first transistor of the second conductivity type and a second transistor of the first conductivity type, and the first semiconductor substrate in the first transistor has a first high concentration region of the first conductivity type and having the third impurity concentration which is higher than the first impurity concentration, and the first high concentration region is formed from under the first channel formation regions to under the respective first and second semiconductor regions, in the surface of the first semiconductor substrate under the first channel formation region, and in a region at a predetermined depth from the surface of the first semiconductor substrate under the first semiconductor region.

The second semiconductor substrate in the second transistor includes a second high concentration region of the second conductivity type and having the fourth impurity concentration which is higher than the second impurity concentration, and the second high concentration region is formed from under the second channel formation region to under the respective third and fourth semiconductor regions, in the surface of the second semiconductor substrate under the second channel formation region, and in a region at a predetermined depth from the surface of the second semiconductor substrate under the third and fourth semiconductor regions.

Accordingly, in the first and second transistors of the semiconductor device according to the fourth aspect, when a predetermined voltage is applied to the first and second gate electrodes to enter an operation state, the first and second high concentration regions suppress the extension of depletion layers in the surface regions of the semiconductor substrates under the channel formation regions to surely prevent the short channel effect.

Also, as the surface regions of the semiconductor substrates under the first and second, and third and fourth semiconductor regions are set to the first and second impurity concentrations which are relatively low, depletion layers can be extended to sufficiently decrease the junction capacitance in the vicinity of regions to be drain regions in the first though fourth semiconductor regions. That is to say, in the CMOS structure, both the suppression of the short channel effect and a decrease in the junction capacitance can be obtained.

As a result, both the suppression of the short channel effect and a decrease of the junction capacitance can be provided in the CMOS structure and a complementary semiconductor device formed of first and second transistors can be obtained which is capable of high speed operation without deterioration of performance characteristics.

Also, the first semiconductor substrate and the second semiconductor substrate of the semiconductor device according to the fifth aspect are formed adjacent each other and the first and second semiconductor substrates further include third and fourth high concentration regions in their surfaces, respectively, and the third high concentration region is supplied with the first power-supply voltage and the fourth high concentration region is supplied with the second power-supply voltage, and the first and second power-supply voltages are set so that a reverse bias is established between the first semiconductor substrate and the second semiconductor substrate.

Accordingly, even though the first semiconductor substrate and the second semiconductor substrate are adjacent to each other, current will not flow between the first semiconductor substrate and the second semiconductor substrate.

According to the sixth aspect of the present invention, in the step (f) of the method of manufacturing a semiconductor device, impurity, ions of the first conductivity type are implanted with predetermined implantation energy from above to form a high concentration region having the second impurity concentration higher than the first impurity concentration in the semiconductor substrate, and the high concentration region is formed from under the channel formation region to under the electrode regions, in the surface of the semiconductor substrate under the channel formation region, and in a region at a predetermined depth from the surface of the semiconductor substrate under the electrode regions.

Then, the gate electrode serving as an ion implantation blocking layer allows accurate formation of the high concentration region in the surface of the semiconductor substrate from under the channel formation region.

Accordingly, in the semiconductor device manufactured by the method of the sixth aspect, when a predetermined voltage is applied to the gate electrode to enter an operation state, the high concentration region certainly suppresses the extension of a depletion layer in the surface region of the semiconductor substrate under the channel formation region to surely prevent the short channel effect.

Furthermore, as the surface region of the semiconductor substrate under the electrode regions is set to the first impurity concentration which is relatively low, a depletion layer can be extended to sufficiently reduce the junction capacitance in the vicinity of a region to be a drain region in the electrode regions.

As a result, a semiconductor device can be obtained which can maintain the high speed operation by sufficiently reducing the junction capacitance in the vicinity of the drain region without deterioration of the performance characteristics by surely avoiding the short channel effect.

According to the manufacturing method of a semiconductor device according to the seventh aspect of the present invention, since the step (f) is carried out without removing the resist formed in the step (e), the resist also serves as an ion implantation blocking layer in addition to the gate electrode. Hence, even if the gate electrode has a relatively thin film thickness, the high concentration region can be accurately formed from under the channel formation region to under the electrode regions, in the surface of the semiconductor substrate under the channel region, and in a region at a predetermined depth from the surface of the semiconductor substrate under each of the electrode regions.

As a result, a difference in level caused by the gate electrode can be reduced, which provides a semiconductor device with enhanced yield of the metal interconnection formed on the gate electrode.

According to the method of manufacturing the semiconductor device according to the eighth aspect of the present invention, the conductive layer is formed of the first and second partial conductive layers and one of the first and second partial conductive layers is a refractory metal layer, and the refractory metal layer serves as a layer for blocking impurity implantation with high blocking capability.

As a result, even if the gate electrode has a relatively small film thickness, a high concentration region can be accurately formed from under the channel formation region to under each of the first and second semiconductor regions, in the surface of the semiconductor substrate under the channel formation region, and in a region at a predetermined depth from the surface of the semiconductor substrate under each of the first and second semiconductor regions when performing the step (f), reducing the difference in level caused by the gate electrode and enhancing the yield of metal interconnection formed on the gate electrode.

According to the method of manufacturing a semiconductor device according to the ninth aspect of the present invention, in the step (c), impurities of the first conductivity type are introduced using the first resist as a mask to form a high concentration region having the second impurity concentration higher than the first impurity concentration in the surface of the semiconductor substrate under the opening of the resist.

Then, in the step (i), the first and second sidewalls are formed on both sides of the gate electrode, the first and second sidewalls being formed so that the high concentration region is located from under the channel formation region to under part of each of the first and second sidewalls.

Thus, according to the semiconductor device manufactured by the manufacturing method of the ninth aspect, when a predetermined voltage is applied to the gate electrode to enter an operation state, the high concentration region certainly suppresses the extension of a depletion layer in the surface region of the semiconductor substrate under the channel formation region to surely prevent the short channel effect.

Furthermore, as the surface region of the semiconductor substrate under the electrode regions is set to the first impurity concentration which is relatively low, a depletion layer can be extended to sufficiently reduce the junction capacitance in the vicinity of a region to be a drain region in the electrode regions.

As a result, a semiconductor device can be obtained which can maintain the high speed operation by sufficiently reducing the junction capacitance in the vicinity of the drain region without deteriorating the performance characteristics by surely avoiding the short channel effect.

Further, although a positional error may occur between the high concentration region and the gate electrode because the gate electrode formed in the step (g) and the high concentration region 1 formed in the step (c) are formed independently of each other, the positional error will not cause the trouble of formation of the high concentration region extending to under the first and second semiconductor regions since the high concentration region is formed extending from under the channel formation region to under part of the first and second additional semiconductor regions.

The present invention has been made to solve the problems describe earlier, and it is an object of the present invention to obtain a semiconductor device of the LDD structure which suppresses increase of leakage current and drain capacitance even if an SOI substrate with a thin buried oxide film is used and has both of the operational stability and high speed, and a manufacturing method thereof.

These and other objects, features, aspects and advantages of the present invention will become more apparent from the following detailed description of the present invention when taken in conjunction with the accompanying drawing.

DESCRIPTION OF THE PREFERRED EMBODIMENTS

First Preferred Embodiment

<First Mode>

Figure 1:
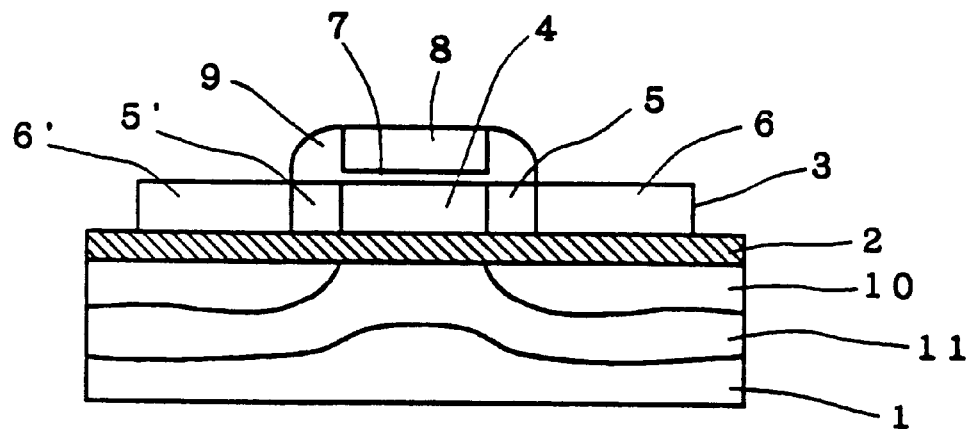
FIG. 1 is a sectional view showing the structure of a semiconductor device according to a first preferred embodiment of the present invention.

FIG. 1 is a sectional view showing the structure of a semiconductor device of the LDD structure according to a first mode of a first preferred embodiment of the present invention.

As shown in the Figure, a silicon layer 3 is provided on a silicon substrate 1 with a buried oxide film 2 interposed therebetween. Part of the silicon layer 3 is removed or selectively oxidized so as to be electrically isolated from other elements.

A gate electrode 8 is provided on the silicon layer 3 with a gate insulating film 7, such as a thin oxide film of about 100 angstroms interposed therebetween. A channel formation region 4 for formation of a channel is provided in part of the silicon layer 3 under the gate electrode 8. Usually, the conductivity type of the channel formation region 4 is P-type in NMOS and N-type in PMOS, which is formed by introducing impurities of a conductivity type opposite to that of the source, drain portions, but which may be of the accumulation mode in which impurities of the same conductivity type as the source and drain are introduced according to circumstances.

Sidewalls 9 are formed on the side wall of the gate electrode 8 on both sides of the channel formation region 4. An additional drain region 5 and an additional source region 5' are formed under the sidewalls 9, 9, and a drain region 6 and a source region 6' are formed adjacent to the additional drain region 5 and the additional source region 5', respectively.

In such a structure, if a certain gate voltage is applied to the gate electrode 8, carriers of the same conductivity type as the source, drain are caused in the channel formation region 4, and the amount of the carriers changes depending on the gate voltage, and thus the MOS operation of controlling the current value with the gate voltage is obtained.

The additional drain region 5 and the additional source region 5' are used to moderate the drain electric field to enhance the operational breakdown voltage.

Actually, the drain region 6, the source region 6' and the gate electrode 8 are respectively connected to metal lines with low resistance, such as aluminum, for extension to enable connections with other transistors, and the like.

In the semiconductor device of the first mode of the first preferred embodiment, a high concentration region 11 with boron of about $1\times10^{18}/cm^3$ introduced therein is formed extending from under the channel formation region 4 to under the drain region 6 and the source region 6' in the silicon substrate 1, as shown in FIG. 1. This high concentration region 11 is formed in the surface of the silicon substrate 1 under the channel formation region 4, and is formed at a certain depth from the surface of the silicon substrate 1 under the drain region 6 and the source region 6'. Other region of the silicon substrate 1 than the high concentration region 11 is all a low concentration region with boron of about $1\times10^{15}$–$1\times10^{16}$/cm$^3$ introduced therein, so that a low concentration region 10 is formed in the surface of the silicon substrate 1 under the drain region 6 and the source region 6'.

Figure 2:
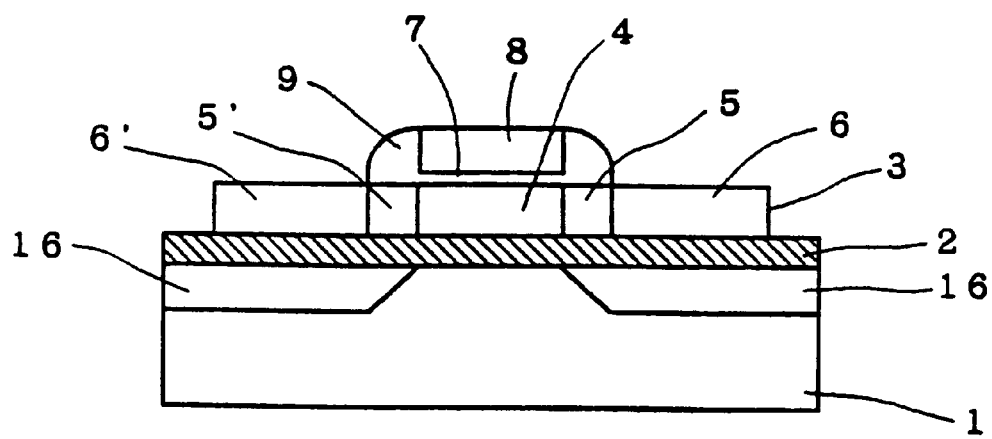
FIG. 2 is a sectional view showing effects of the semiconductor device of the first preferred embodiment.

This way, since formation of the high concentration region 11 in the surface of the silicon substrate 1 under the channel formation region 4 sets the substrate concentration of the silicon substrate 1 high, extension of a depletion layer 16 in this region is suppressed as shown in FIG. 2 and the short channel effect caused by a rise of potential in the interface of the channel formation region 4 on the buried oxide film 2 side caused by the depletion layer extending in the silicon substrate 1 can be surely prevented, as in the conventional structure, and then the leakage current is not increased and the performance characteristics are not deteriorated.

Further, since the low concentration region 10 is formed in the surface of the silicon substrate 1 under the drain region 6 and the source region 6' and its impurity concentration is set to a low concentration of about $1\times10^{15}$–$1\times10^{16}$/cm$^3$, the depletion layer 16 deeply extends to about 1.8 µm–4500 angstroms in the vicinity of the drain when the drain voltage is 2.5 V, as shown in FIG. 2, which reduces to junction capacitance in this region and maintains high speed operation without incurring operational reduction.

For example, if the buried oxide film 2 has a thickness of 800 angstroms, formation of the low concentration region 10 of about $1\times10^{15}$/cm$^3$ allows the depletion layer to extend by about 1.8 µm, reducing the capacitance in this region (called drain capacitance) to ⅛ as compared with the case of using a high concentration substrate. Accordingly, if a simple circuit with negligible interconnection capacitance is considered, contribution of the drain capacitance to the speed is about 50%, and the total capacitance can be reduced to about 60%, thus enhancing the speed performance by about 1.7 times.

As the high concentration region 11 is formed from the drain region 6 to the source region 6' and the high concentration region 11 cuts off contact between the potential rise on the drain side and the potential rise on the source side, no trouble occurs with the potential rise.

Figure 3:
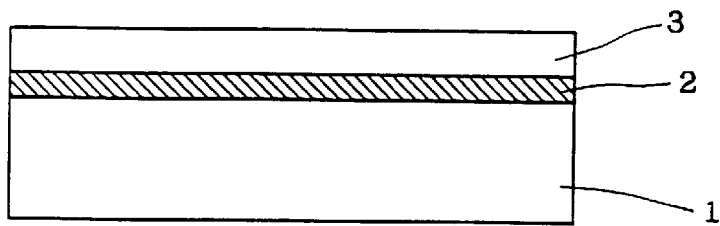
FIG. 3 is a sectional view showing a method of manufacturing the semiconductor device of the first preferred embodiment.
Figure 4:
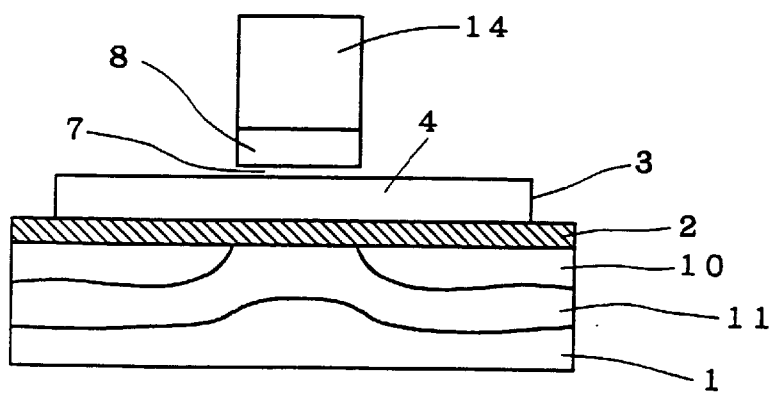
FIG. 4 is a sectional view showing the method of manufacturing the semiconductor device of the first preferred embodiment.
Figure 5:
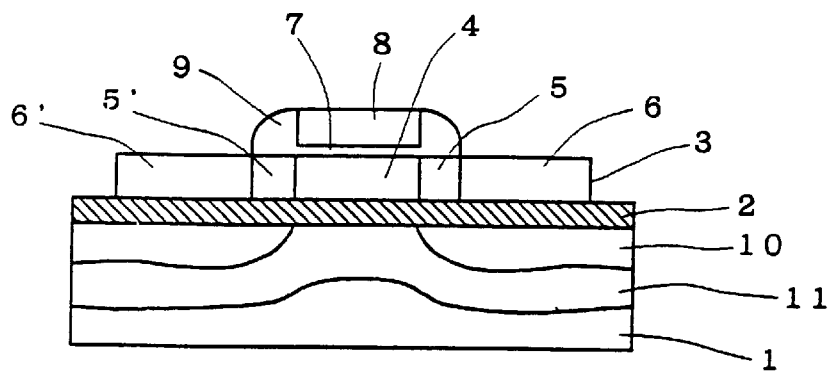
FIG. 5 is a sectional view showing the method of manufacturing the semiconductor device of the first preferred embodiment.

FIG. 3–FIG. 5 are sectional views showing a manufacturing method of the first mode of the first preferred embodiment.

As shown in FIG. 3, the silicon layer 3 is formed on the silicon substrate 1 with the buried oxide film 2 interposed therebetween. Usually, oxygen ions of about 0.4–2.0$\times10^{18}$/cm$^2$ are added into the silicon substrate, and then a high temperature heat treatment at about 1300° C. is performed to form such structure. A method of forming by sticking silicon substrates with oxidized surface may, also be adopted.

Next, part of the silicon layer 3 is removed by the reactive ion etching (RIE) using photoresist, and an active region in which elements are formed is formed in the remaining region. Here, an active region may be formed by oxidizing isolation region by the selective oxidation method. Next, boron is added by about $5\times10^{11}$/cm$^2$ at 20 keV to form the channel formation region 4. Now, the p-type impurities are introduced, but n-type impurities may be introduced according to circumstances. Subsequently, with the gate insulating film 7 of about 100 angstroms interposed therebetween, a gate electrode material formed of an n-type polysilicon film with phosphorus doped therein is deposited. Here, a photoresist 14 is provided in the region to be the gate electrode 8, and the polysilicon film is etched using the photoresist 14 as a mask to form the gate electrode 8.

Next, an implant of boron is applied with the photoresist 14 left on the gate electrode 8, and the surface high concentration region 11 is formed in the silicon substrate 1 under the channel formation region 4 as shown in FIG. 4. The high concentration region 11 is formed at a certain depth from the surface of the silicon substrate 1 under the region other than the channel formation region 4.

The formation of the high concentration region 11 can be realized by implanting boron with implantation energy adjusted so that the impurity concentration in the interface of the silicon substrate 1 under the channel formation region 4 where the gate electrode 8 exists is in the order of $10^{18}$/cm$^3$, and under the regions where the source, drain regions 6, 6' are formed, the concentration of the inside of the silicon substrate 1 is high and that in the surface remains a low concentration of the order of $10^{15}$–$10^{16}$/cm$^3$.

For example, if the gate electrode 8 is formed of polysilicon, and if its film thickness is 2000 angstroms, the film thickness of the photoresist 14 is 1 µm, the film thickness of the silicon layer 4 is 500 angstroms, and the film thickness of the buried oxide film layer 2 is 800 angstroms, and when the implantation energy of boron is set to 650 keV and a dose thereof is set to $10^{14}$/cm$^2$, the concentration in the silicon substrate 1 interface under the channel formation region 4 will be set to about $10^{18}$/cm$^3$, the surface concentration of the silicon substrate 1 under the regions in which the source, drain regions 6, 6' are formed will be set to about $5\times10^{15}$/cm$^3$, and the concentration inside of the silicon substrate 1 under the regions in which the source, drain regions 6, 6' are formed will be set to the order of $10^{18}$/cm$^3$, respectively.

At this time, as the gate electrode 8 and the photoresist 14 serve as ion implantation block layers, the high concentration region 11 (an be accurately formed only in the surface of the silicon substrate 1 under the (channel formation region 4.

Subsequently, after removing the photoresist 14, phosphorus is added by about $1\times10^{13}$/cm$^2$ at 30 keV to form the n-type additional drain region 5 and the additional source region 5'. Furthermore, after depositing a CVD oxide film of about 1500 angstroms, the sidewall 9 is formed on the side wall of the gate electrode 8 by the RIE. After that, arsenic is added by about $2\times10^{15}$/cm$^2$ at 50 keV to form the n-type drain region 6 and the source region 6', and thus the structure shown in FIG. 5 is obtained.

The first mode of the first preferred embodiment has been shown in an example of the NMOS, but it is a matter of course that the same structure can be obtained in the PMOS only with opposite conductivity.

<Second Mode>

Figure 6:
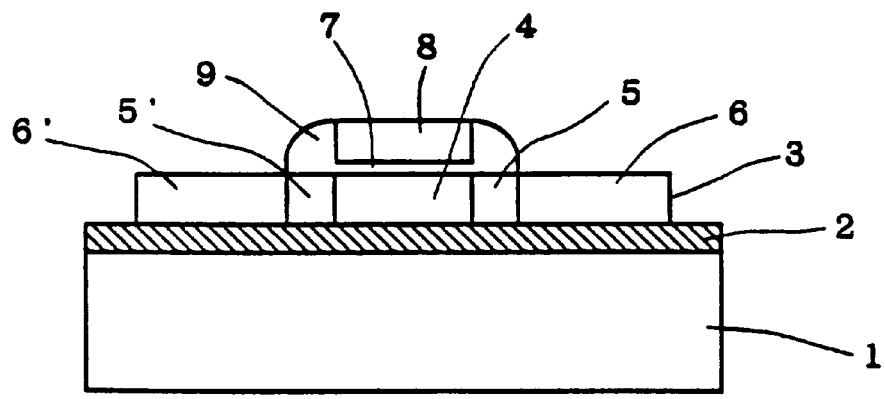
FIG. 6 is a sectional view showing another method of manufacturing the semiconductor device of the first preferred embodiment.
Figure 7:
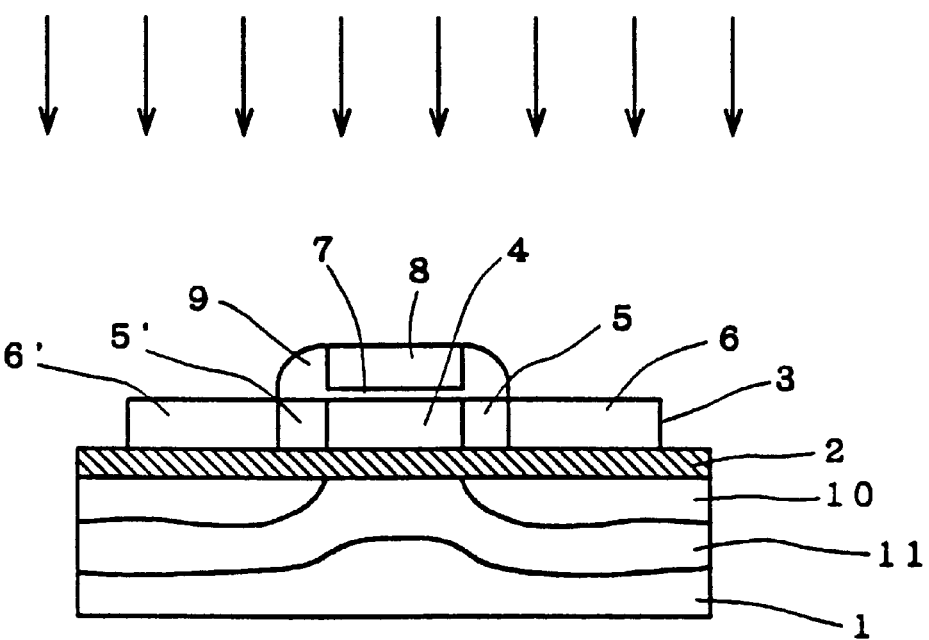
FIG. 7 is a sectional view showing another method of manufacturing the semiconductor device of the first preferred embodiment.

It can also be manufactured according to a second mode in which the structure shown in FIG. 6 with the sidewall 9, the additional drain region 5, the additional source region 5', the drain region 6 and the source region 6' is obtained by using the processes described above as they are except the process of forming the high concentration region 11 and then boron 12 is implanted using the gate electrode 8 as a mask to form the high concentration region 11, as shown in FIG. 7. In the case of the second mode, it is only the gate electrode 8 that serves as a layer for blocking impurity implantation, it is therefore necessary to appropriately select the film thickness of the gate electrode 8 so that the difference in concentration is large between the high concentration region 11 under the channel formation region 4 and the low concentration region 10 under the source, drain regions 6, 6'.

Accordingly, in the manufacturing method of the first mode shown in FIG. 3–FIG. 5, as compared with the manufacturing method of the second mode shown in FIG. 6 and FIG. 7, the high concentration region 11 can be formed more accurately in the region from under the channel formation region 4 to under the drain region 6 and the source region 6', in the surface of the silicon substrate 1 under the channel formation region 4 and in a region at a certain depth from the surface of the silicon substrate I under the drain region 6 and the source regnion 6', even if the film thickness of the gate electrode 8 is relatively thin, for the photoresist 14 also serves as an ion implantation blocking layer.

As a result, a difference in level caused by the gate electrode 8 is reduced and then a semiconductor device with enhanced yield of the metal interconnection formed on the gate electrode 8 can be obtained.

<Third Mode>

Figure 8:
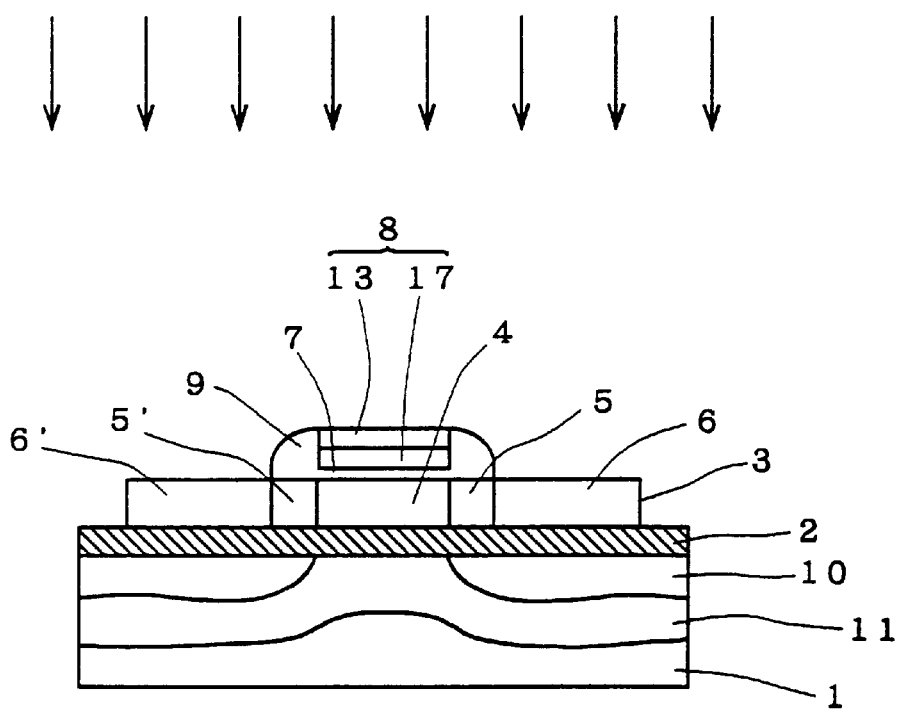
FIG. 8 is a sectional view showing another mode of the semiconductor device of the first preferred embodiment.

FIG. 8 is a sectional view showing a third mode of the first preferred embodiment. In the third mode, for the purpose of increasing the difference in concentration between the low concentration region 10 and the high concentration region 11, the gate electrode 8 is formed of a polysilicon layer 17 and a refractory metal 13 such as $WSi_2$ etc., as shown in FIG. 8, so that the refractory metal layer 13 serves as a implantation block layer with high blocking ability to impurities such as boron forming the high concentration region, and therefore the low concentration region 10 and the high concentration region 11 can be accurately formed without making large the film thickness of the gate electrode 8.

As a result, the difference in level caused by the gate electrode 8 is reduced to produce the effect of enhancing the yield of metal interconnection formed on the gate electrode 8. The gate electrode 8 of the third mode is manufactured as follows.

After depositing a gate electrode material formed of a polysilicon film, a refractory metal layer is formed. Then, photoresist is provided in the region to be the gate electrode 8 and the polysilicon film and the refractory metal layer are etched using the photoresist as a mask to form the gate electrode 8 formed of the polysilicon layer 17 and the refractory metal layer 13.

Next, after removing the photoresist 14, an implant of boron is applied to form the high concentration region 11 in a surface of the silicon substrate 1 under the channel formation region 4 as shown in FIG. 8. The high concentration region 11 is formed at a predetermined depth from the surface of the silicon substrate 1 under the drain region 6 and the source region 6'. Other processes are the same as those in the manufacturing method of the first mode described referring to FIG. 3 through FIG. 5.

<Second Preferred Embodiment>

Figure 9:
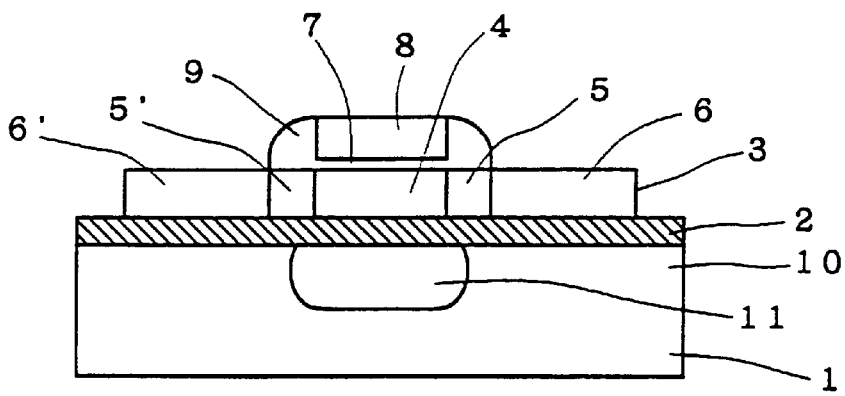
FIG. 9 is a sectional view showing the structure of a semiconductor device according to a second preferred embodiment of the present invention.
Figure 10:
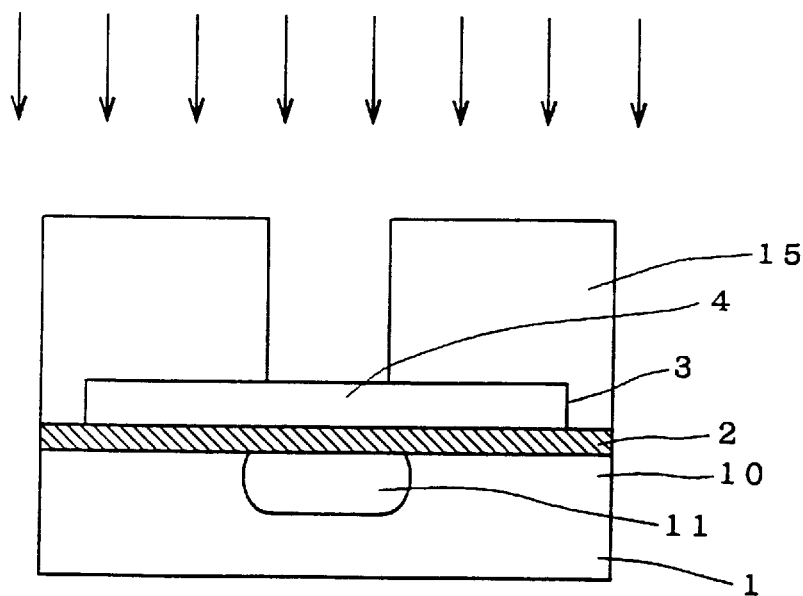
FIG. 10 is a sectional view showing a method of manufacturing the semiconductor device of the second preferred embodiment.

FIG. 9 is a sectional view showing the structure of a semiconductor device with the LDD structure of a second preferred embodiment of the present invention.

In the semiconductor device of the second preferred embodiment, the high concentration region 11 is formed only in the surface of the silicon substrate 1 under the channel formation region 4, and part of the additional drain region 5 and the additional source region 5'.

In the first preferred embodiment, the high concentration region 11 was formed inside of the silicon substrate 1 under the source, drain regions 6, 6', but it exists only under the channel formation region 4 in the second preferred embodiment, and only the impurities of about $10^{15}/cm^3$ initially doped in the silicon substrate 1 exist in all the region of the silicon substrate 1 under the source, drain regions 6, 6'. Other structure is the same as that of the first preferred embodiment shown in FIG. 1, and description thereof is not repeated.

In the structure of the second preferred embodiment, since impurities with the same conductivity type as that of the channel formation region 4 are introduced into the high concentration region 11 by about $10^{18}/cm^3$, deterioration of performance characteristics resulting from the short channel effect caused by a rise in potential in the buried oxide film layer 2 can be prevented.

Also, since the surface of the silicon substrate 1 under the drain region 6 and the source region 6' is a silicon substrate 1 with a low concentration, a depletion layer deeply extends to about 1.8 $\mu$m–4500 angstroms in the vicinity of the drain when the drain voltage is 2.5 V, which reduces the capacitance in this region, and high speed operation can be maintained without incurring operational reduction.

The boundary between the high concentration region 11 and the silicon substrate 1 in the semiconductor device of the second preferred embodiment lies under part of the additional drain region 5 and the additional source region 5'. As the additional drain region 5 and the additional source region 5' are required to play an intermediate role between the channel formation region 4 and the drain region 6 (the source region 6'), occurrence of the boundary between the high concentration region 11 and the silicon substrate 1 under this region is preferable to prevent deterioration of the performance characteristics and to maintain high speed operation.

Now, a method of manufacturing the semiconductor device of the second preferred embodiment will be described.

An SOI substrate having a silicon layer 3 of 50 nm on a buried oxide film layer 2 of 80 nm is used as a starting material. After forming an isolation region by removing or selectively oxidizing part of the silicon layer 3, photoresist 15 of about 1 $\mu$m is applied and an opening is formed in a portion where the gate electrode 8 and the channel formation region 4 are formed. Then, boron of about $1 \times 10^{13}/cm^2$ is implanted with implantation energy of 40 keV. Under this condition, the concentration in the outermost surface of the silicon substrate 1 under the channel formation region 4 becomes about $1 \times 10^{18}/cm^3$, and the high concentration region 11 is formed.

Subsequently, the gate electrode 8, the sidewall 9, the additional drain, source regions 5, 5' and the drain, source regions 6, 6' are sequentially formed according to the same processes in the first preferred embodiment except the process of forming the high concentration region 11, and then interconnections are provided thus to obtain a desired structure.

Although a positional error may possibly occur in formation of the high concentration region 11 and the gate electrode 8 because the high concentration region 11 is formed before forming the gate electrode 8 in the second preferred embodiment, the occurrence of positional error will not produce a trouble that the high concentration region 11 is formed as far as under the drain region 6, or the source region 6', for the high concentration region 11 is formed extending from under the channel formation region 4 to under part of the additional drain region 5 and the additional source region 5'.

Although the description has been made on the example of NMOS in the second preferred embodiment, it is a matter of course that the same structure can be obtained in the PMOS with the only difference of opposite conductivity type.

<Third Preferred Embodiment>

Figure 11:
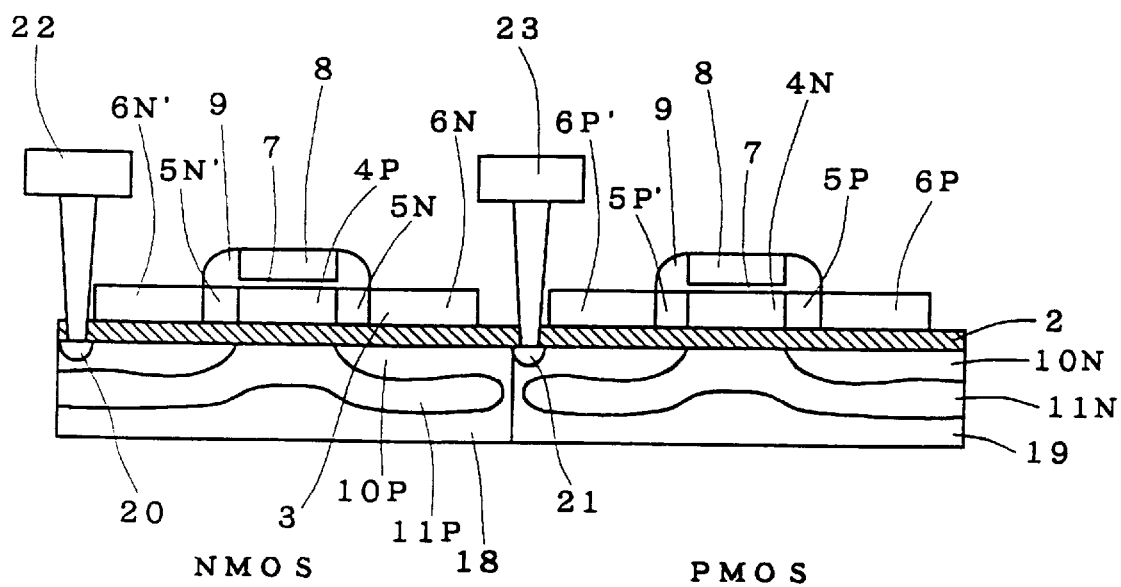
FIG. 11 is a sectional view showing the structure a semiconductor device according to a third preferred embodiment of the present invention.
Figure 12:
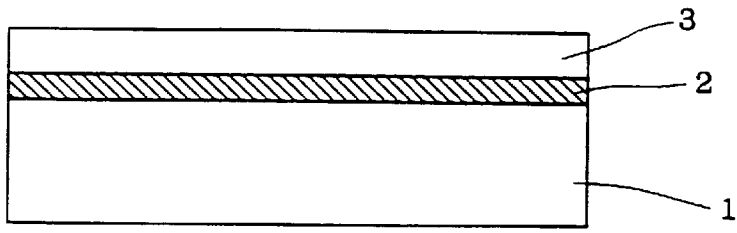
FIG. 12 is a sectional view showing a method of manufacturing a conventional semiconductor device.
Figure 13:
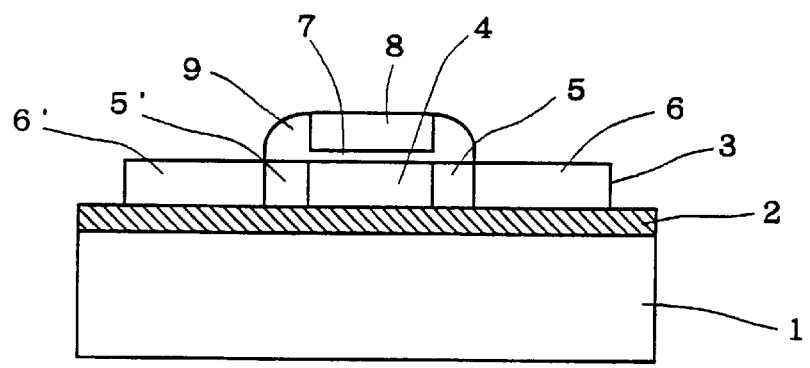
FIG. 13 is a sectional view showing the method of manufacturing the conventional semiconductor device.
Figure 14:
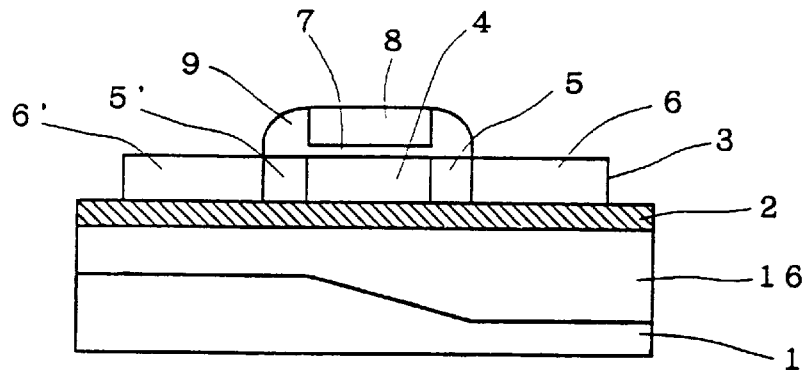
FIG. 14 is a sectional view indicating a problem of the conventional semiconductor device.
Figure 15:
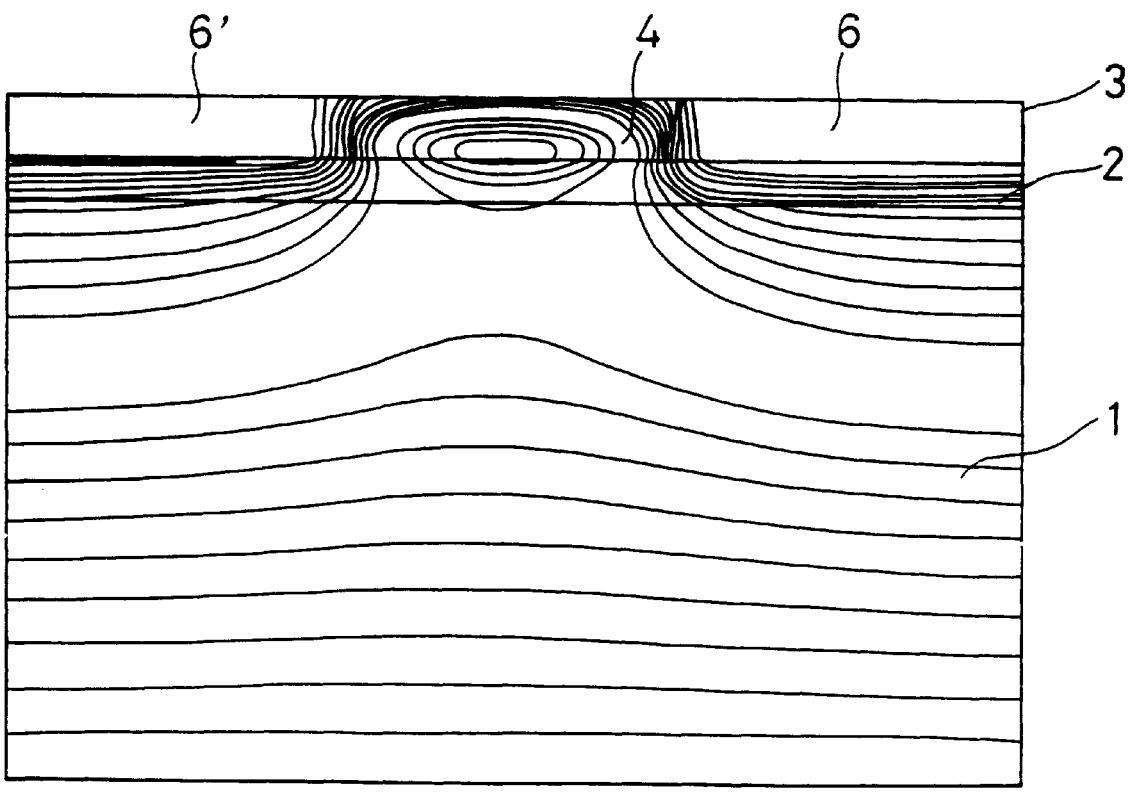
FIG. 15 is a description diagram indicating the problem of the conventional semiconductor device.

FIG. 11 is a sectional view showing a semiconductor device with the LDD structure of a third preferred embodiment. As shown in the figure, the third preferred embodiment shows a CMOS structure with an NMOS transistor and a PMOS transistor. Here, letters N, P are added to the characters indicative of corresponding parts in the NMOS and PMOS, as 5N, 5P, etc.

The NMOS transistor is formed on a p-type substrate region 18 and the PMOS transistor is formed on an n-type substrate region 19. The p-type substrate region 18 and the n-type substrate region 19 are formed adjacent each other. Further, the p-type substrate region 18 is connected to an NMOS substrate electrode 22, to which a ground potential is applied, through a p-type body region 20 formed in its surface and the n-type substrate region 19 is connected to a PMOS substrate electrode 23, to which a power-supply potential is applied, through an n-type body region 21 formed in its surface.

With such structure, reverse bias is set between the p-type substrate region 18 and the n-type substrate region 19, and a current does not flow between the p-type substrate region 18 and the n-type substrate region 19, and the same effects as a simple MOS can be obtained as a semiconductor device of the CMOS structure similarly to the first and second preferred embodiments with respect to both the NMOS and PMOS which have been impossible in a single conductive substrate.

That is to say, formation of a high concentration region 11N (11P) in the surface of the p-type substrate region 18 (the n-type substrate region 19) under a channel formation region 4P (4N) surely prevents the short channel effect caused by an increase in potential in the interface of the channel formation region 4 on the buried oxide film 2 side, and causes no deterioration of the operational characteristics.

Furthermore, a low concentration region 10N (10P) is formed in the surface of the p-type substrate region 18 (the n-type substrate region 19) under a drain region 6N (6P) and a source region 6' (6'P) and its impurity concentration is set to a low concentration of about $1 \times 10^{15} - 1 \times 10^{16}/cm^3$, so that the capacitance in this region can be reduced and high speed operation can be maintained without incurring operational reduction.

It is also possible to reduce the resistance between the p-type body region 20 and the high concentration region 11N and the resistance between the n-type body region 21 and the high concentration region 11P by bringing the p-type body region 20 and the high concentration region 11N, and the n-type body region 21 and the high concentration region 11P into contact, respectively.

While the invention has been described in detail, the foregoing description is in all aspects illustrative and not restrictive. It is understood that numerous other modifications and variations can be devised without departing from the scope of the invention.

We claim:

1. A method of manufacturing a semiconductor device, comprising the steps of:

(a) preparing a base body including a semiconductor substrate of a first conductivity type and having a first impurity concentration, an insulating layer formed on said semiconductor substrate, and a semiconductor layer formed on said insulating layer;

(b) selectively forming an insulating film on said semiconductor layer;

(c) forming a conductive layer on said insulating film;

(d) forming a resist on said conductive layer and patterning the resist into a predetermined form;

(e) performing an etching process to said conductive layer using said resist as a mask, said remaining conductive layer and said insulating film being defined as a gate electrode and a gate insulating film, respectively, said semiconductor layer being defined as a channel formation region in a region under said gate electrode and being defined as electrode regions in other region;

(f) implanting impurities of said first conductivity type with predetermined implantation energy from above to form a high concentration region having a second impurity concentration higher than said first impurity concentration in said semiconductor substrate, said high concentration regions being formed from under said channel formation region to under said electrode regions, said high concentration region being formed in a surface of said semiconductor substrate under said channel formation region, and in a region at a predetermined depth from the surface of said semiconductor substrate under said electrode regions;

(g) introducing impurities of the second conductivity type into said semiconductor layer using said gate electrode as a mask;

(h) forming first and second sidewalls on both sides of said gate electrode; and (i) introducing impurities of a second conductivity type into said semiconductor layer using said gate electrode and said first and second sidewalls as masks, said semiconductor layer being defined as first and second additional semiconductor regions of the second conductivity type in regions under said first and second sidewalls, and defined as first and second semiconductor regions of the second conductivity type in regions adjacent to said first and second additional semiconductor regions, respectively, on sides opposite to said channel formation region, and a predetermined voltage is applied to said gate electrode to cause a current to flow between said first semiconductor region and said second semiconductor region through said channel formation region.

2. The method of manufacturing a semiconductor device according to claim 1, wherein said step (f) is carried out without removing said resist formed in said step (e).

3. The method of manufacturing a semiconductor device according to claim 1, wherein said steps (f)–(i) are carried out in the order of (f), (g), (h), (i).

4. The method of manufacturing a semiconductor device according to claim 1, wherein said steps (f)–(i) are carried out in the order of (g), (h), (i), (f).

5. The method of manufacturing a semiconductor device according to claim 1, further comprising a step (j) of introducing impurities of the first conductivity type or the second conductivity type into said semiconductor layer, which is performed after said step (a).

6. The method of manufacturing a semiconductor device according to claim 1, wherein said conductive layer is formed of first and second partial conductive layers, and said step (c) comprises the steps of (c-1) forming said first partial conductive layer on said insulating film and (c-2) forming said second partial conductive layer on said first partial conductive layer, one of said first and second partial conductive layers being a refractory metal layer.

7. A method of manufacturing a semiconductor device, comprising the steps of:
 (a) preparing a base body including a semiconductor substrate of a first conductivity type and having a first impurity concentration, an insulating layer formed on said semiconductor substrate, and a semiconductor layer formed on said insulating layer
 (b) forming a resist on said semiconductor layer and patterning to provide an opening in the center of the first resist;
 (c) introducing impurities of said first conductivity type using said first resist as a mask to form a high concentration region having a second impurity concentration higher than said first impurity concentration in the surface of said semiconductor substrate under the opening of said resist;
 (d) selectively forming an insulating film on said semiconductor layer;
 (e) forming a conductive layer on said insulating film;
 (f) forming a second resist on said conductive layer and patterning the second resist into a predetermined form;
 (g) performing an etching process to said conductive layer using said second resist as a mask, said remaining conductive layer and said insulating film being defined as a gate electrode and a gate insulating film, respectively, said semiconductor layer being defined as a channel formation region in a region under said gate electrode and defined as electrode regions in other regions;
 (h) introducing impurities of a second conductivity type into said semiconductor layer using said gate electrode as a mask;
 (i) forming first and second sidewalls on both sides of said gate electrode, said first and second sidewalls being formned so that said high concentration region is located to extend only from under said channel formation region to under parts of respective said first and second sidewalls; and
 (j) introducing impurities of the second conductivity type into said semiconductor layer using said gate electrode and said first and second sidewalls as masks, said semiconductor layer being defined as first and second additional semiconductor regions of the second conductivity type under said first and second sidewalls, respectively, and defined as first and second semiconductor regions of the second conductivity type in regions adjacent to said first and second additional semiconductor regions, respectively, on sides opposite to said channel formation region, and a predetermined voltage is applied to said gate electrode to cause a current to flow between said first semiconductor region and said second semiconductor region through said channel formation region.

* * * * *